(12) United States Patent
Tarasov et al.

(10) Patent No.: US 11,081,292 B2
(45) Date of Patent: Aug. 3, 2021

(54) METHOD FOR PRODUCING A FILM OF LIGHT-ABSORBING MATERIAL WITH A PEROVSKITE-LIKE STRUCTURE

(71) Applicant: JOINT STOCK COMPANY KRASNOYARSK HYDROPOWER PLANT (JSC KRASNOYARSK HPP), Krasnoyarsky Krai (RU)

(72) Inventors: Alexey Borisovich Tarasov, Moscow (RU); Nikolai Andreevich Belich, Kaluzhskaia (RU); Evgeny Alekseevich Gudilin, Moscow (RU); Andrey Andreevich Petrov, St. Petersburg (RU); Aleksei Iurievich Grishko, Volgograd (RU)

(73) Assignee: JOINT STOCK COMPANY KRASNOYARSK HYDROPOWER PLANT (JSC KRASNOYARSK HPP), Krasnoyarsky Krai (RU)

( * ) Notice: Subject to any disclaimer, the term of this patent is extended or adjusted under 35 U.S.C. 154(b) by 0 days.

(21) Appl. No.: 16/637,724

(22) PCT Filed: Aug. 6, 2018

(86) PCT No.: PCT/RU2018/050093
§ 371 (c)(1),
(2) Date: Feb. 7, 2020

(87) PCT Pub. No.: WO2019/031991
PCT Pub. Date: Feb. 14, 2019

(65) Prior Publication Data
US 2021/0020383 A1    Jan. 21, 2021

(30) Foreign Application Priority Data
Aug. 10, 2017    (RU) .......................... RU2017128559

(51) Int. Cl.
*H01G 9/20*    (2006.01)
*C23C 14/06*    (2006.01)
(Continued)

(52) U.S. Cl.
CPC ....... *H01G 9/2009* (2013.01); *C23C 14/0694* (2013.01); *C23C 14/5846* (2013.01);
(Continued)

(58) Field of Classification Search
CPC ................ H01G 9/2009; H01G 9/0036; C23C 14/5846; H01L 51/0007; H01L 51/0028; H01L 51/0077; H01L 51/4253
See application file for complete search history.

(56) References Cited
U.S. PATENT DOCUMENTS
9,391,287 B1    7/2016  Huang et al.

OTHER PUBLICATIONS

International Search Report in International Application No. PCT/RU2018/050093, dated Jan. 3, 2019 (in 6 pages).
(Continued)

*Primary Examiner* — Anthony Ho
(74) *Attorney, Agent, or Firm* — Knobbe, Martens, Olson & Bear, LLP

(57) ABSTRACT

The invention relates to a method for synthesis of films made of light-absorbing material with perovskite-like structure which can be used for fabrication of perovskite solar cells. The method for synthesis of films made of light-absorbing material with perovskite-like structure with a structural formula $ACB_3$ is characterized by sequential deposition of a layer of a reagent C onto a layer of a reagent AB with a thickness determined by stoichiometry of the reaction followed by the immersion of the layers in a liquid or gaseous medium containing reagent $B_2$ where component A states for $CH_3NH_3^+$, $(NH_2)_2CH^+$, $C(NH_2)_3^+$, $Cs^+$ or a mixture thereof, component B states for $Cl^-$, $Br^-$, $I^-$ or a mixture thereof,
(Continued)

component C states for metals Sn, Pb, Bi, or their melts, oxides, salts. The technical result achieved using the claimed invention is a simple and fast method for fabrication of a layer of light-absorbing organic-inorganic material with a perovskite-like structure which is homogeneous due to the formation of a film of the intermediate phase $AB\text{-}B_2$ with improved morphology on the surfaces of a large area due to rapid crystallization, which allows the obtained material to be used in solar cells of large area.

6 Claims, 1 Drawing Sheet

(51) Int. Cl.
- *C23C 14/58* (2006.01)
- *C23C 28/04* (2006.01)
- *H01G 9/00* (2006.01)
- *H01L 51/00* (2006.01)
- *H01L 51/42* (2006.01)

(52) U.S. Cl.
CPC ........... *C23C 28/04* (2013.01); *H01G 9/0036* (2013.01); *H01L 51/0007* (2013.01); *H01L 51/0028* (2013.01); *H01L 51/0077* (2013.01); *H01L 51/4253* (2013.01)

(56) References Cited

OTHER PUBLICATIONS

Petrov, et al. 2017 "A new formation strategy of hybrid perovskites via room temperature reactive polyiodide melts," Materials Horizons, vol. 4 (No. 4): 625-632.

He, et al. 2016 "Using elemental Pb surface as a precursor to fabricate large area $CH_3NH_3PbI_3$ perovskite solar cells," Applied Surface Science, vol. 389: 540-546.

METHOD FOR PRODUCING A FILM OF LIGHT-ABSORBING MATERIAL WITH A PEROVSKITE-LIKE STRUCTURE

FIELD OF THE INVENTION

The invention relates to methods of fabrication of organic-inorganic light-absorbing materials with perovskite-like structure which can be used for example in fabrication of perovskite solar cells.

BACKGROUND

The prior art discloses the methods of obtaining light-absorbing materials with perovskite-like structure.

Within the framework of this application these structures refer directly to perovskite structure as well as to structures with various structural variations (the term is described in detail in the source of information Attfield J. P., Lightfoot P., Morris R. E. Perovskites//Dalt. Trans. 2015. Vol. 44, No 23. P. 10541-10542).

In particular, the article [Burschka J. et al. Sequential deposition as a route to high-performance perovskite-sensitized solar cells//Nature.—2013.—T. 499.—No. 7458.—C. 316.] describes a method for the fabrication of thin film of perovskite $CH_3NH_3PbI_3$ in two steps by means of deposition of $PbI_2$ solution onto the substrate in a form of a layer with necessary thickness by rotating it at a high speed around the axis perpendicular to its plane (spin-coating method) followed by immersing the resulting thin layer of $PbI_2$ in MAI solution in isopropanol.

The article [Saliba M. et al. Incorporation of rubidium cations into perovskite solar cells improves photovoltaic performance//Science (80-.). 2016. Vol. 354, No 6309. P. 206-209.] describes fabrication of thin layer of perovskite $CH_3NH_3PbI_3$ in one-step by means of deposition of perovskite solution in a mixture of organic solvents onto the substrate in a form of a thin layer by rotating it at a high speed around the axis perpendicular to its plane.

The disadvantage of the abovementioned methods is the impossibility of obtaining a layer of the initial component ($PbI_2$) or perovskite from the solution on large-area substrates and the impossibility of obtaining perovskite with large area solar cells accordingly.

The patent CN104250723, Sep. 9, 2014, Zhi Zheng, Cheng Camry, Lei Yan, Jia Huimin, Ho Wei Wei, He Yingying "Chemical method for in-situ large-area controlled synthesis of perovskite type $CH_3NH_3PbI_3$ membrane material based on lead simple-substance membrane" describes a method for the preparation of perovskite $CH_3NH_3PbI_3$ by means of immersion of films of metallic lead, which can be easily deposited uniformly with a controllable thickness over large areas, to a solution of iodine and methylammonium iodide in an organic solvent, for example ethanol. Metallic lead in the form of an even layer is deposited by magnetron sputtering on the nonporous surface of the electron-conducting layer. After that, it is brought into contact with an organic solvent containing molecular iodine and methylammonium iodide. As a result, a continuous nonporous layer of lead transforms into a continuous nonporous layer of perovskite.

The patent CN105369232, Feb. 16, 2015, Zhi Zheng, He Yingying, Lei Yan, Cheng Camry, Jia Huimin, Ho Wei Wei, "Lead-based perovskite-type composite elemental thin-film in-situ wide area control $CH_3NH_3PbBr_3$ film material chemical method" describes a method for the preparation of perovskite $CH_3NH_3PbBr_3$ by means of immersion of films of metallic lead, which can be easily deposited uniformly with a controllable thickness over large areas, to a solution of methylammonium bromide in an organic solvent, for example isopropanol.

The disadvantage of the abovementioned methods is the need to use a solvent and poor control over the morphology of the resulting perovskite layer, which complicates and slows down the technological process of organic-inorganic perovskite fabrication, leading to production, health, and environmental risks.

The article Mater. Horiz., 2017, 4, 625-632, Petrov Andrey A., Belich Nikolai A., Grishko Aleksei Y., Stepanov Nikita M., Dorofeev Sergey G., Maksimov Eugene G., Shevelkov Andrei V., Zakeeruddin Shaik M., Michael Graetzel, Tarasov Alexey B., Goodilin Eugene A., «A new formation strategy of hybrid perovskites via room temperature reactive polyiodide melts» describes a method of preparation of a perovskite layer without solvents as a result of the reaction of a metallic lead layer and the reagent with the general composition $MAI_{3+x}$ applied to it.

The disadvantage of the known method is the difficulty in achieving a homogeneous distribution of a viscous polyiodide (polyhalide) reagent over a large substrate area, as well as lack of control and deviations of the stoichiometry in the interaction, which, in particular, can lead to the formation of a lead iodide sublayer. The reagents deposited onto the substrate are a liquid melt, which leads to a certain complexity in controlling the stoichiometric ratio of precursors during the film formation reaction of the final product. As a result, the quality (in particular, the thickness uniformity and the phase composition) of the resulting film decreases, which, accordingly, negatively affects the efficiency of the final product based on the fabricated films, for example, a solar cell.

SUMMARY OF THE INVENTION

A technical problem solved by the claimed invention is the creation of a technological method for producing light-absorbing organic-inorganic materials with a perovskite-like structure on large-area substrates without the use of a solvent.

The technical result achieved by using the claimed invention is to provide the possibility of obtaining a single-phase film without pinholes with a high uniformity, which will allow the material to be used in large-area solar cells. The method is also characterized by its manufacturability and ease of implementation, which makes it more accessible for use in industrial production. The claimed method is carried out without the use of a solvent, which contributes to the improvement of the quality of the final product due to the elimination of the possibility of its undesirable interaction with the components of the produced perovskite, and also potentially allows to achieve more ecological production.

The formulated task is solved by the approach in which a film made of a light-absorbing material with a perovskite-like structure having the structural formula $ACB_3$ is obtained according to a technical solution in the following way: a layer of a reagent C and a layer of a reagent AB are sequentially deposited onto the substrate, then the substrate with the deposited layers is immersed in a liquid or gaseous medium containing reagent $B_2$ for a period necessary necessary and sufficient for proceeding the reaction $C+AB+B_2=ACB_3+X$ where component A states for $CH_3NH_3^+$, $(NH_2)_2CH^+$, $C(NH_2)_3^+$, $Cs^+$ or a mixture thereof, component B states for $Cl^-$, $Br^-$, $I^-$ or a mixture thereof, component C states for metals Sn, Pb, Bi, their melts, oxides, or salts, component X states for a decomposition product of the component C while it was used in a form of an oxide or a salt. The liquid medium is characterized by insolubility of the reagent AB in it and solubility of $B_2$. Reagents C and AB are applied per unit area in a stoichiometric amount providing a film of a given thickness. Components C and AB are deposited by vacuum sputtering, electrochemical deposition, aerosol spraying of a solution or spin-coating. When the reaction is completed, the excess of the component B can be removed by washing in a solvent, dropping the solvent on the surface, annealing at an elevated temperature, evaporation under reduced pressure. In the case of the use of oxide or salt as the component C, the removal of component X is additionally ensured after the completion of the reaction $C+AB+B_2=ACB_3+X$. Dry air, argon, or nitrogen containing iodine vapors (halogens or mixtures thereof) or iodine vapors (halogens or mixtures thereof) without a carrier gas can be used as a gaseous phase; $CCl_4$, toluene, diethyl ether and other organic solvents containing iodine (halogens or mixtures thereof) can be used as a liquid phase.

Apart from the analogues, within the framework of the claimed invention it is possible to control precisely the stoichiometry of the reaction of the formation of a film made of a light-absorbing material by means of a preliminarily controlled deposition of the precursor films (AB and C) onto the substrate in a ratio strictly defined by deposition parameters. Upon further treatment of the bilayer film containing components AB and C with a solution or gas containing component $B_2$, a homogeneous film made of the reactive mixture $AB-B_2$ in an amount strictly defined by the previously deposited component AB is formed on its surface. Further, this reaction mixture reacts with the layer of the component C to form the final product, which makes it possible to achieve high homogeneity of the films over a large area.

When a substrate with a layer of the reagent C and a stoichiometric amount of reagent AB deposited on it is immersed in a liquid or gaseous medium containing reagent $B_2$, the reagent AB reacts with the reagent $B_2$ and the formation of the composition $AB-nB_2$ ($n\geq 1$) which reacts with the reagent C. As a result, perovskite $ACB_3$ is formed according to the following intermediate reaction: $AB-nB_2+C=ACB_3+[(n-3)/2]B_2$.

Within the framework of the claimed method, the achievement of the technical result, namely the production of single-phase highly homogeneous films of a light-absorbing material with a large area, is achieved by controlling the stoichiometry of the reaction of a light-absorbing material film formation. The main parameters influencing the achievement of the technical result are the thickness and uniformity of the films C and AB deposited on the substrate, as well as the conditions for further interaction of the resulting bilayer film with a solution or gas containing the component $B_2$. In order to obtain the most homogeneous single-phase films of $ACB_3$, it is recommended to apply uniformly thick films of the components AB and C with a thickness corresponding to an equimolar ratio of the amounts of the components AB and C per unit area. In the case of significant deviations in the ratio of the components, the formation of additional phases in the films of the final product is possible.

BRIEF DESCRIPTION OF THE FIGURES

The claimed invention is explained with the following drawings and pictures, in particular representing the results of the embodiment of the claimed method for specific compositions.

The positions on the figures are denoted as following:
1—substrate
2—the reagent C deposition
3—the reagent AB deposition
4—gaseous medium or a solution containing $B_2$.

DETAILED DESCRIPTION OF THE INVENTION

The claimed invention can be embodied using known means and methods, including in conditions of industrial production.

Any conductive or non-conductive material or a combination thereof can be used as the substrate. The area and choice of the substrate material can be limited by the requirements of further specific technological steps of the light-absorbing layer formation, however can potentially be arbitrary. Based on the area of the substrate and particular thickness of the film, the required amount of reagents C and AB is determined. To implement the method, a reagent C is deposited onto the selected substrate by known methods. The most optimal is the use of metallic lead, tin or bismuth as C, which are deposited, for example, by vacuum deposition or by electrochemical deposition. In the case of using oxides or salts of the component C, it is also possible to use other methods for forming films in addition to the above-mentioned ones, for example, spin-coating, spraying the solution onto a substrate, spray pyrolysis, chemical vapor deposition (CVD), etc. A layer of the component AB is deposited onto a layer of C by means of methods such as sputtering (including vacuum deposition), spin-coating, spraying the solution onto the substrate. Thus, a bilayer film with two sequentially deposited layers C and AB is formed. In order to carry out the reaction of the formation of the film made of the light-absorbing material with a perovskite-like structure, the obtained substrate with deposited layers is immersed in a liquid or gaseous medium, which contains $B_2$. Dry air, argon, or nitrogen containing iodine vapors (halogens or mixtures thereof) or iodine vapors (halogens or mixtures thereof) without a carrier gas can be used as a gaseous phase; $CCl_4$, toluene, diethyl ether and other organic solvents containing iodine (halogens or mixtures thereof) can be used as a liquid phase. As a result of the experiments it was established that the optimal characteristics for carrying out the described reaction are performed by iodine vapors with any of the carrier gases or in their absence, as well as solutions of iodine in toluene and $CCl_4$. The recommended reaction temperature is 0-150° C.

Figure 1:
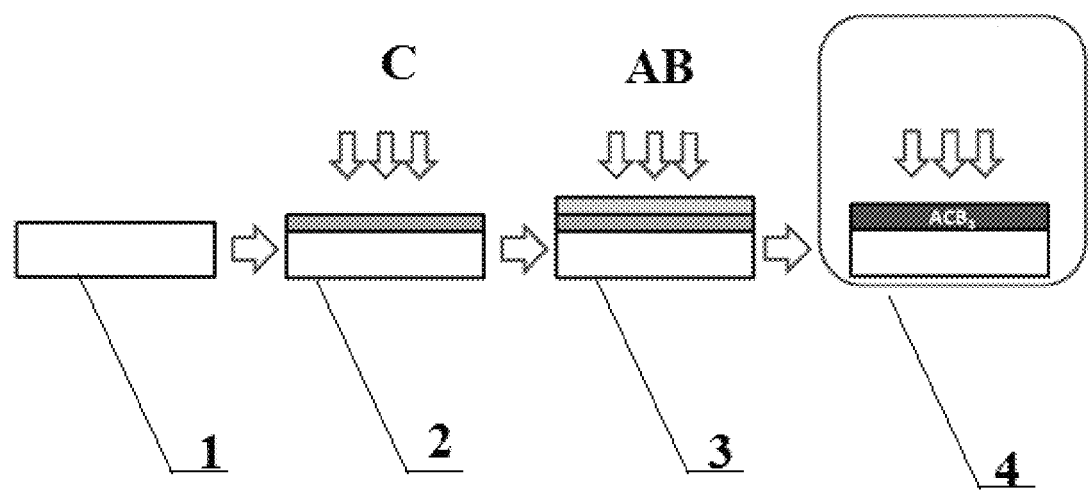
FIG. 1 shows a scheme of the claimed method for the synthesis of films of light absorbing materials with the composition ACB3.
Figure 2:
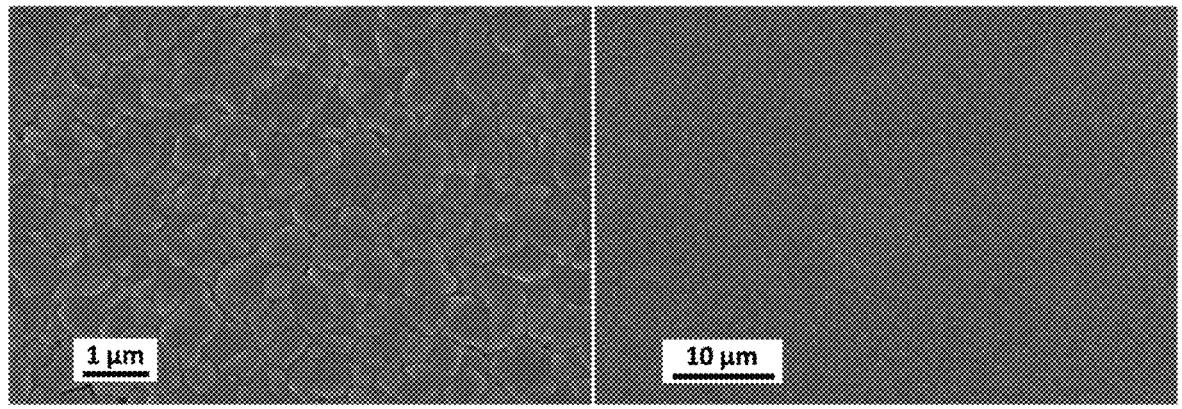
FIG. 2 shows microphotographs of a film of light-absorbing organic-inorganic perovskite $CH_3NH_3PbI_3$, obtained according to the claimed method.

For each specific case, the duration of the process is determined by the rate of the chemical reaction until it is completed. Completeness of the process can be controlled by X-ray phase analysis, etc. At the end of the reaction, the resulting film on the substrate is withdrawn from the chamber containing the medium with the component $B_2$. The quality of the resulting film is examined by means of electron microscopy used for evaluation of the parameters such as the continuity of the film (the absence of pinholes) and the average size of the crystallites. It was established that the film of the light-absorbing compound $CH_3NH_3PbI_3$ obtained by the described method has a uniform structure, as seen in FIG. 2, is characterized by the absence of pinholes and an average crystallite size of about 800 nm.

EXAMPLES

Information on the embodiment of the claimed method and the fabrication of a film of a light absorbing compound $CH_3NH_3PbI_3$ using various components as reagents is provided as examples of particular embodiments.

Example 1

A 60 nm thick layer of lead was deposited by vacuum thermal evaporation on the substrate, consisting of a blocking layer of $TiO_2$, deposited on a conductive substrate of FTO (fluorinated tin oxide) or ITO (indium doped tin oxide). A MAI layer was then deposited onto the lead layer by vacuum thermal evaporation in the amount corresponding to an equimolar ratio of the amounts of metallic lead and MAI per unit area of the substrate. After that, the substrate with deposited layers was immersed into saturated iodine vapors in argon and held at 40° C. for 10 to 30 minutes. As a result, a layer of perovskite-like structure $MAPbI_3$ was formed on the substrate. The morphology and phase composition of the film were examined by scanning electron microscopy (FIG. 2) and X-ray phase analysis.

Example 2

A 250 nm thick layer of lead was deposited by vacuum thermal evaporation on the substrate, consisting of a blocking layer of $TiO_2$, deposited on a conductive substrate of FTO (fluorinated tin oxide) or ITO (indium doped tin oxide). A MAI layer was then deposited onto the lead layer by vacuum thermal evaporation in the amount corresponding to an equimolar ratio of the amounts of metallic lead and MAI per unit area of the substrate. After that, the substrate with deposited layers was immersed in a solution of iodine in $CCl_4$ with an $I_2$ content of 10 mg/ml and kept at room temperature for 90 seconds. As a result, a layer of perovskite-like structure $MAPbI_3$ was formed on the substrate. The morphology and phase composition of the film were examined by scanning electron microscopy and X-ray phase analysis.

Example 3

A 250 nm thick layer of lead was deposited by vacuum thermal evaporation on the substrate, consisting of a blocking layer of $TiO_2$, deposited on a conductive substrate of FTO (fluorinated tin oxide) or ITO (indium doped tin oxide). A layer consisting of a mixture of MAI and FAI in a molar ratio of 1:1 was then deposited onto the lead layer by vacuum thermal evaporation in the amount corresponding to a molar ratio of 2:1 of the amounts of metallic lead and MAI per unit area of the substrate. After that, the substrate with deposited layers was immersed in a solution of iodine in $CCl_4$ with an $I_2$ content of 10 mg/ml and kept at room temperature for 90 seconds. As a result, a layer of perovskite-like structure $MA_{0.5}FA_{0.5}PbI_3$ was formed on the substrate. The morphology and phase composition of the film were examined by scanning electron microscopy and X-ray phase analysis.

Examples of the embodiment of the method with various compounds as reagents are given below.

TABLE 1

| C | AB | $B_2$ | Reaction medium | Reaction time | Phase composition | Average size of crystallites | Uniformity |
|---|---|---|---|---|---|---|---|
| Pb | MAI | $I_2$ | $I_2$/argon | 3 min | $MAPbI_3$ | 800 nm | No pinholes |
| Pb | MAI | $I_2$ | $I_2$/apron | 10 min | $MAPbI_3$ | 800 nm | No pinholes |
| Pb | MAI | $I_2$ | $I_2/CCl_4$ | 1 min | $MAPbI_3$ | 750 nm | No pinholes |
| $PbI_2$ | MAI | $I_2$ | $I_2/CCl_4$ | 1 min | $MAPbI_3$ | 900 nm | No pinholes |
| Pb | MABr | $I_2$ | $I_2$/argon | 5 min | $MAPbBr_xI_{3-x}$ | 300 nm | No pinholes |
| Pb | FAI | $I_2$ | $I_2/CCl_4$ | 1 min | $FAPbI_3$ | 450 nm | No pinholes |
| Pb/Sn (9/1) | MAI | $I_2$ | $I_2$/argon | 3 min | $MAPb_{0.9}Sn_{0.1}I_3$ | 800 nm | No pinholes |
| $PbO_2$ | MAI | $I_2$ | $I_2$/argon | 1 min | $MAPbI_3$ | 450 nm | No pinholes |

In the examples described above (Table 1) of the embodiment of the method, highly homogeneous films of a light-absorbing material $ACB_3$ with a perovskite-like structure were obtained by a method ensuing the possibility of fabrication of the corresponding films of large area.

The invention claimed is:

1. A method for synthesis of films made of light-absorbing material with perovskite-like structure with a structural formula $ACB_3$, the method comprising:
    sequentially applying to a substrate a layer of a reagent C and a layer of a reagent AB, and
    placing the substrate with the applied layers in a liquid or gaseous medium containing reagent $B_2$ for a period necessary and sufficient for the reaction to complete $(C+AB+B_2=ACB_3+X)$,
    wherein A is selected from the group consisting of $CH_3NH_3^+$, $(NH_2)_2CH^+$, $C(NH_2)_3^+$, $Cs^+$ and a mixture thereof, B is selected from the group consisting of $Cl^-$, $BR^-$, $I^-$ and a mixture thereof, C is a metal selected from the group consisting of Sn, Pb, Bi, and a melt, oxide or salt thereof, and X is an optional decomposition product of C if C is in a form of an oxide or a salt.

2. The method as claimed in claim 1, wherein the reagent AB is insoluble in the liquid or gaseous medium and reagent $B_2$ is soluble in the liquid or gaseous medium.

3. The method as claimed in claim 1 wherein the reagents C and AB are applied per unit area in a stoichiometric amount providing a film with a given thickness.

4. The method as claimed in claim 1 wherein the reagents C and AB are applied by deposition, vacuum deposition, rotating substrate or spraying the solution onto a substrate.

5. The method as claimed in claim 1 wherein C is an oxide or salt and X is removed from the reaction.

6. The method as claimed in claim 1 wherein an excess of B, upon completion of the reaction, is removed by:
   washing in a solvent,
   dropping the solvent on the surface,
   annealing at an elevated temperature, or
   evaporation under reduced pressure.

\* \* \* \* \*